United States Patent
Schaffer et al.

(10) Patent No.: US 7,044,753 B2
(45) Date of Patent: May 16, 2006

(54) ELECTRIC CONTACT ASSEMBLY

(75) Inventors: Kurt-Michael Schaffer, Eckental (DE); Eike Waltz, Aptos, CA (US); Werner Körber, Betzenstein (DE)

(73) Assignee: Rittal RES Electronic Systems GmbH & Co. KG, Herborn (DE)

(*) Notice: Subject to any disclaimer, the term of this patent is extended or adjusted under 35 U.S.C. 154(b) by 0 days.

(21) Appl. No.: 10/473,290

(22) PCT Filed: Mar. 22, 2002

(86) PCT No.: PCT/EP02/03245

§ 371 (c)(1),
(2), (4) Date: Sep. 26, 2003

(87) PCT Pub. No.: WO02/078134

PCT Pub. Date: Oct. 3, 2002

(65) Prior Publication Data

US 2004/0149476 A1 Aug. 5, 2004

(30) Foreign Application Priority Data

Mar. 28, 2001 (DE) ................ 101 15 525

(51) Int. Cl.
*H01R 4/66* (2006.01)
(52) U.S. Cl. ............. 439/92; 174/35 R; 361/800
(58) Field of Classification Search ............ 439/92; 361/800; 174/35 R
See application file for complete search history.

(56) References Cited

U.S. PATENT DOCUMENTS

| 4,300,016 A | | 11/1981 | Bergeron et al. |
| 5,124,889 A | * | 6/1992 | Humbert et al. ............. 361/818 |
| 5,746,326 A | * | 5/1998 | Hong ....................... 211/41.17 |
| 5,885,118 A | * | 3/1999 | Billenstein et al. ......... 439/862 |
| 5,894,106 A | | 4/1999 | Schwenk et al. |
| 5,930,120 A | | 7/1999 | Gunther et al. |
| 5,934,915 A | * | 8/1999 | Henningsson et al. ........ 439/92 |
| 6,120,304 A | * | 9/2000 | Harwood et al. ............. 439/92 |
| 6,159,024 A | * | 12/2000 | Munch et al. ................ 439/92 |

FOREIGN PATENT DOCUMENTS

| DE | 91 04 045.0 U1 | 8/1991 |
| DE | 41 14 484 C2 | 12/1993 |
| DE | 36 04 860 C2 | 6/1994 |
| DE | 195 44 835 C1 | 10/1996 |
| DE | 198 46 627 C1 | 1/2000 |
| EP | 0 517 134 A1 | 12/1992 |

* cited by examiner

*Primary Examiner*—Thanh-Tam Le
(74) *Attorney, Agent, or Firm*—Pauley Petersen & Erickson

(57) ABSTRACT

A contact assembly having a spring contact strip and a contact element, in particular, a subrack front panel. The spring contact strip has a contact limb that is bent over, with an end that can be freely pivoted. To improve the mechanical stability of the spring contact strip, the inventive contact limb extends an entire length of the spring contact strip.

16 Claims, 2 Drawing Sheets

ELECTRIC CONTACT ASSEMBLY

Figure 1:
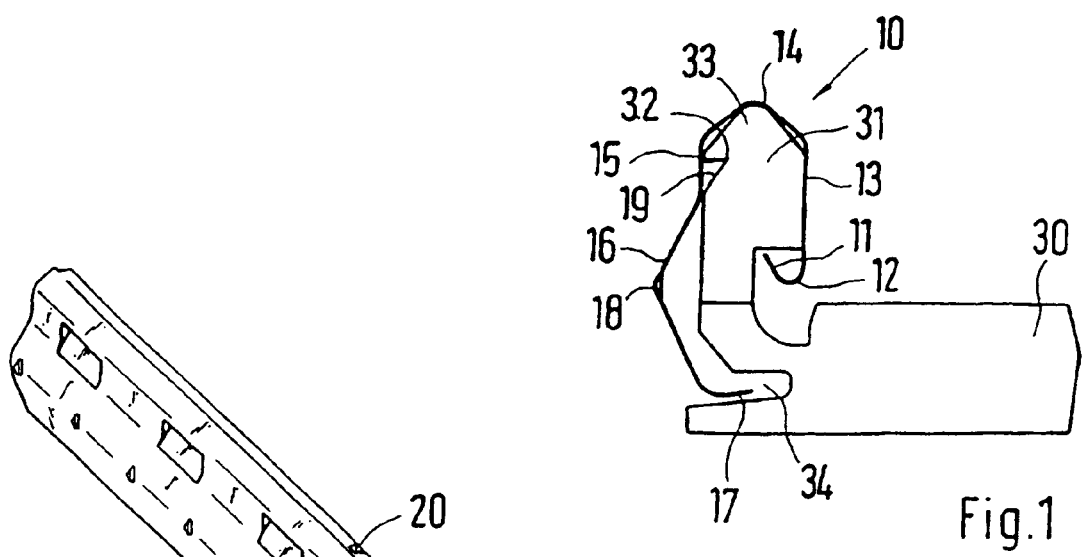

The invention relates to a contact assembly with a contact spring strip and a contact element, in particular of a front plate of a component support, wherein the contact spring strip has a contact leg, which is bent off and whose end can be swiveled out.

Such a contact assembly is known from DE 198 46 627 C1. Here a contact spring strip is used, from which a contact spring leaf and a clamping leaf extend alternatingly in rows. The contact spring leaves are separated from the clamping leaves. In this way the contact spring leaf can freely swivel out at its free end. But the clamping leaf is snapped into a detent strip of a front plate and is fixedly maintained thereon. The contact spring strip is in an electrically conducting connection with the front plate. Adjoining lined-up components can be put in electrically conducting contact in the area of their front plates by means of the contact spring leaves. In the course of the structural layout it must be taken into consideration that the contact spring strips can be subjected to mechanical stresses. This is the case in particular where projections, for example remnants of solder or soldering pins, of adjoining components become snagged at the contact spring strips during assembly or disassembly of the components in a component support.

A contact spring strip is disclosed in DE 195 44 835 C1, which has a continuous detent shoulder extending in the longitudinal profile direction. A plurality of contact springs is bent away from this. They are arranged next to each other and are spaced apart from each other by means of separating slits. A relatively large outlay for profiling and punching is needed in connection with these contact spring strips.

It is the object of the invention to produce a contact arrangement of the type mentioned at the outset, wherein the contact spring strip is of simple construction and is insensitive to mechanical effects.

This object is attained in that the contact leg extends continuously in the longitudinal direction of the contact spring strip.

In contrast to contact spring strips which were commonly used up to now, a continuous contact leg is used in accordance with the invention. With this, the danger of damage by mechanical forces is clearly reduced.

In particular, the contact leg prevents protruding elements of adjacent components from becoming snagged. Moreover, because of the use of continuous contact legs it is possible to realize a substantially simplified construction along with a reduced punching and profiling outlay.

It is provided in accordance with a preferred embodiment variation of the invention that the contact spring strip has a continuous contact line or contact face on its contact leg, which extends in the longitudinal direction of the contact spring. This assures dependable shielding, even under the most diverse EMC requirements.

For improving the contactability, it can be provided that spaced-apart contact elements are arranged on the contact line or contact face, which protrude past the contact line or contact face and which can be provided with contact edges or contact tips. When mounting the front plate, the contact elements can be supported on or dig into the surface of an adjoining component with which contact is to be made.

In a preferred manner, the contact elements have been punched out of the contact leg and are bent away from it. In this case the punched edges then constitute the contact edges or contact tips.

It is also conceivable for the contact elements to be embodied as embossed nubs. These can also be embossed in such a way that tear edges are created in the course of the embossing process. These are then used for improving the contact.

In a preferred embodiment the contact elements are either spring-elastically resilient in defined areas, or they are connected to the contact spring strip via spring areas. A tolerance compensation can be realized by means of this In order to always assure a sufficiently adequate EMC protection it is provided in accordance with a possible variation of the invention that the contact elements are arranged with identical spacing from each other, wherein the spacing distance is determined by EMC considerations. Since the contact elements lie next to each other at predetermined distances, electromagnetic waves are prevented from passing through the contact zone in an impermissible manner.

A stable connection between the contact spring strip and the detent strip results in particular if it is provided that the contact leg is bent away from a bar of the contact spring strip, and that catches are punched out in the transition area between the bar and the contact leg and are bent off in the direction toward the detent strip of the front plate. Due to the fact that the bar at the contact strip can be embodied to be continuous, an optimized positioning and dimensioning of the detent tongues is possible when laying out the contact spring strip.

A contact arrangement in accordance with the invention can also be such that a connecting section follows the contact leg and is connected with a support element, which is snapped together with the detent strip. Accordingly, the contact spring strip is constituted of two parts.

In this case the support element can be embodied to be substantially U-shaped and can be clampingly maintained by means of a bar and a holding strip on two oppositely located sides of the detent strip. The bar is connected with the holding strip by means of a cap section. Here, the connecting section of the contact leg is connected with the support element in the area of the cap section.

It can also be alternatively provided for the contact spring strip to have a holding strip, which is connected via a cap section with a bar, that the holding strip, the bar and the cap section enclose, at least partially, a head section at the end of the detent strip, and that the contact leg is angled off the bar in the direction facing away from the detent strip. A single-piece closed element, which is particularly simply designed is the result of this embodiment. It is insensitive to mechanical stresses in particular.

Figure 2:
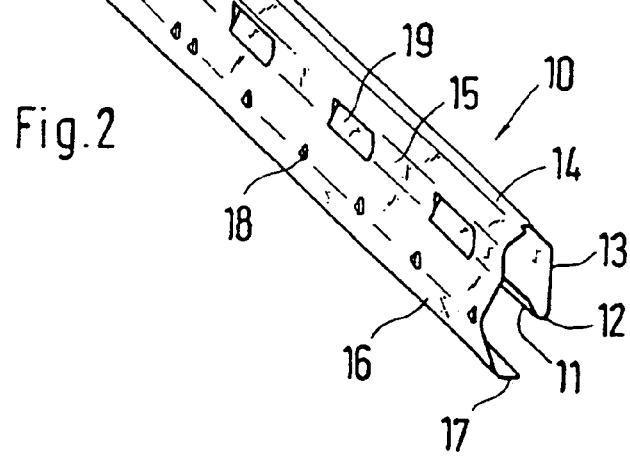
Figure 3:
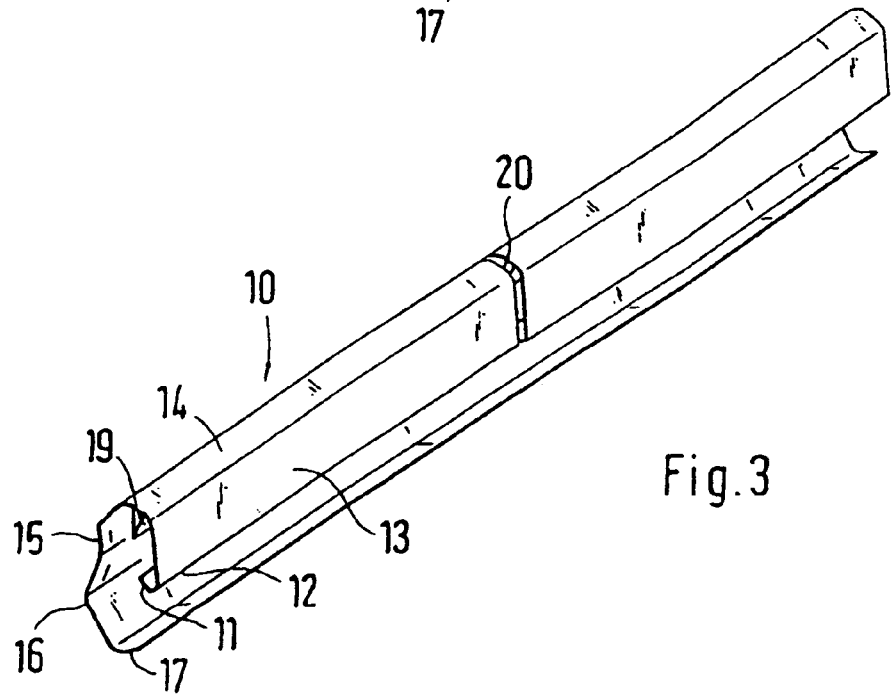
Figure 4:
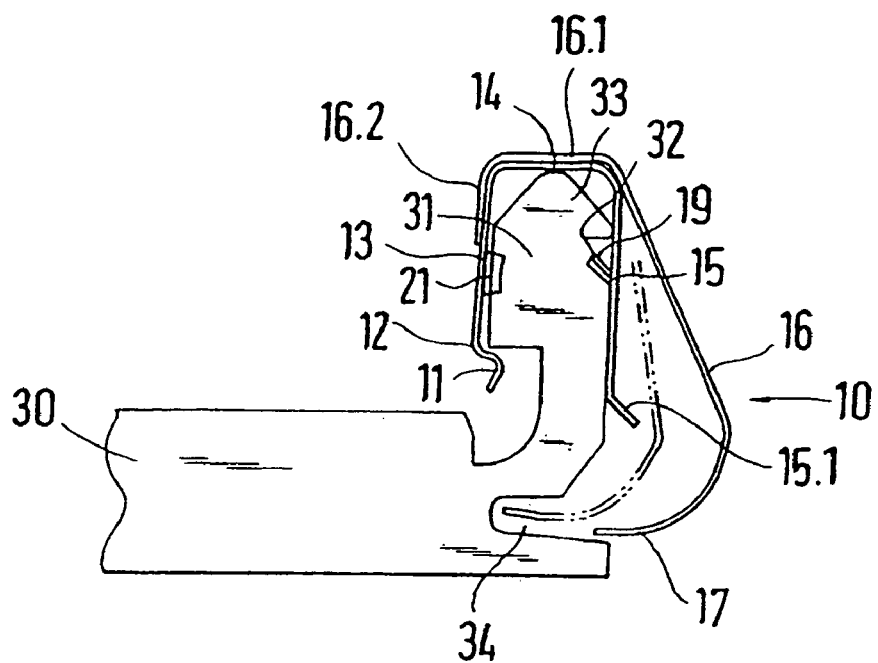
Figure 5:
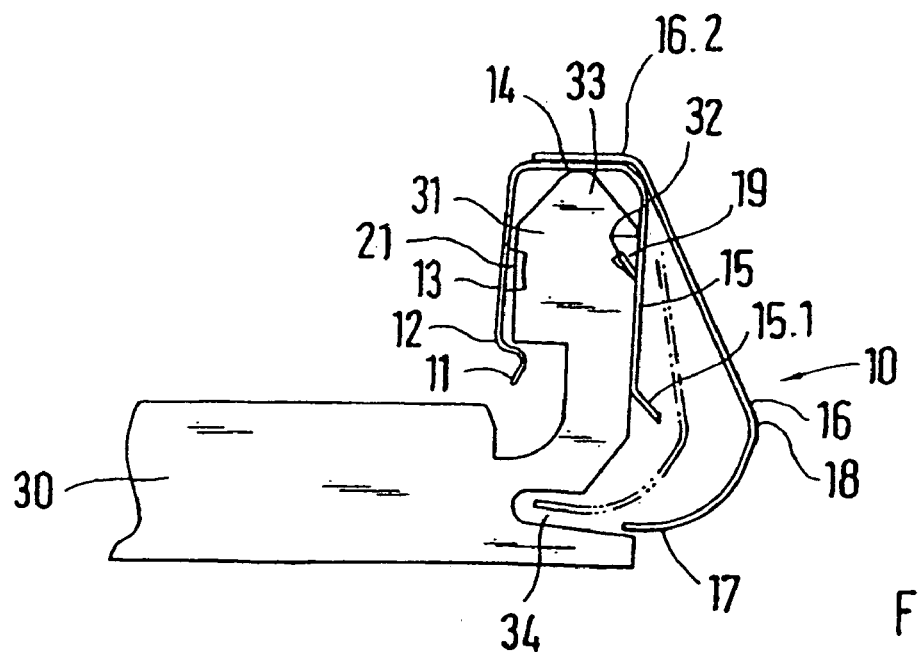

In what follows, the invention will be explained in greater detail by means of exemplary embodiments represented in the drawings. Shown are in:

FIG. 1, a lateral view of a contact assembly, consisting of a contact spring strip and a component support front plate, FIG. 2, the contact spring strip represented in FIG. 1 in a perspective front view, FIG. 3, the contact spring strip represented in FIG. 2 in a perspective rear view, FIG. 4, a further embodiment variation of a contact assembly with a component support front plate and a contact spring strip in a lateral view, and FIG. 5, a lateral view of the component support front plate represented in FIG. 2, but with a modified contact spring strip.

A component support front plate (called front plate 30 for short in what follows) is represented in FIG. 1. The front plate 30 has a plate-like section at the front, which is adjoined at right angles by a detent strip 31. On its free end, the detent strip 31 has a head area 33. On its exterior, the head area 33 is provided with a continuous groove 32. The front plate 30 furthermore has a groove 34 on the outside in the base area of the detent strip 31. The front plate 30 is embodied in a single piece as a profiled extruded section. A contact spring strip 10 can be placed on the detent strip 31 and the front plate 30. The design of the contact spring strip 10 can be seen in greater detail in FIGS. 2 and 3. As illustrated in these representations, the contact spring strip 10 has a holding strip 13 on its rear, from whose free end an angled-off element 11 is bent off by means of a transition section 12. On the side facing away from the angled-off element 11, the holding strip 13 makes a transition into a U-shaped cap section 14. A bar 15, which can be placed parallel with or slightly angled away from the holding strip 13, adjoins the cap section 14. On its end facing away from the cap section 14, the bar 15 makes a transition into a contact leg 16. The contact leg 16 is essentially put together from two partial legs, which are arranged in a V-shape in respect to each other. The contact leg 16 constitutes a contact face extending continuously in the direction of the contact spring strip 10. On its free end, the contact leg 16 terminates in an inwardly bent end section 17. Catches 19 are punched out of the bar 15 and bent off in the direction toward the holding strip 13. The catches 19 are spaced evenly apart in respect to each other. The catches 19 themselves are bent off in the transition area between the bar 15 and the contact leg 16.

As FIG. 2 shows, contact element 18 are arranged, distributed over the contact face. In the present case the contact elements 18 are embodied as embossed elements, which have been pressed out of the contact face of the contact leg 18 and are bent out in the direction facing away from the holding strip 13. The embossed elements can also be provided with contact edges or contact tips.

It becomes clear from FIG. 3, that the contact spring strip 10 can be provided with a partition slit 20 at regular intervals. In this case the partition slit 20 separates the angled-off element 11, the transition section 12 and the cap section 14. The cap section 14 can be cut through completely or partially here. In the present exemplary embodiment the cap section 14 is only partially cut through. The contact spring strip is provided with an increased stiffness by this.

As can be seen in FIG. 1, the contact spring strip 10 can be simply mounted on the detent strip 30. To this end, the contact spring strip 10 is placed with its transition section 12 on an inclined portion of the head area 33 of the front plate 30. The angled-off element 11 is then deflected at this inclined portion. It can the be displaced along an inner surface of the detent strip 31 until the angled-off element 11 snaps in behind a formed edge of the detent strip 31. In this mounting position the catches 19 also snap into the detent groove 32 of the detent strip 31. In the mounted position, the contact leg 16 is freely swivelable at its end, so that it can be deflected into the groove 34 with the end section 17.

Modified variations of contact spring strips 10 are described in FIGS. 4 and 5. The front plates 30 are essentially of the same construction as the variation of a front plate 30 represented in FIG. 1. The contact spring strip 10 in accordance with FIG. 4 is of two-part construction. Accordingly, a bevel 16.1 is bent off the contact leg 16, which in turn makes a transition into a bent-off connecting section 16.2. The connecting section 16.2 lies flat against the inside of a holding strip 13 of a support element. The connecting section 16.2 is attached to the support element in the area of the holding strip 13. In the head area 33 of the detent strip 31 the bevel 16.1 rests on the cap section 14 of the support element.

Protrusions 21, which are supported on the detent strip 31, are provided for improving the holding of the contact spring strip 10. The protrusions 21 can be embodied as holding claws, which dig into the surface of the detent strip 31 and improve the contact in this way.

In the embodiment variation represented in FIG. 5, a connecting section 16.2 has been bent off the contact leg 16. It rests on the cap section 14 of the support element and is connected with it. Otherwise the design of the contact spring strip 10 corresponds to the form represented in FIG. 4.

The invention claimed:

1. A contact assembly having a contact spring strip and a detent strip of a front plate of a component support, wherein the contact spring strip has a contact leg and a holding strip and mounts on the detent strip with the contact leg and the holding strip disposed on oppositely located sides of the detent strip, the contact leg is bent off from the holding strip, and the contact leg has an end opposite the holding strip that is freely swivelable and can be deflected toward the detent strip, the contact assembly comprising:

the contact leg (16) extending continuously in a longitudinal direction of the contact spring strip (10);

wherein the contact leg bent away from a bar of the contact spring strip;

catches punched out in a transition area between the bar and the contact leg and bent off toward the detent strip of the front plate; and the holding strip connected via a cap section with the bar, wherein the holding strip, the bar and the cap section at least partially enclose a head section at an end of the detent strip and wherein the contact leg is angled off the bar away from the detent strip.

2. The contact assembly in accordance with claim 1, wherein the contact spring strip (10) has one of a contact line and a contact face continuously extending in the longitudinal direction of the contact spring on the contact leg (16).

3. The contact assembly in accordance with claim 2, wherein contact elements (18) spaced apart from each other and protruding past the one of the contact line and the contact face are arranged on the one of the contact line and the contact face.

4. The contact assembly in accordance with claim 3, wherein the contact elements have one of contact edges and contact tips.

5. The contact assembly in accordance with claim 4, wherein the contact elements (18) are punched out of and bent away from the contact leg (16).

6. The contact assembly in accordance with claim 4, wherein the contact elements (18) are nubs embossed out of the contact face.

7. The contact assembly in accordance with claim 6, wherein the contact elements (18) are arranged evenly spaced apart with respect to each other, and a spacing distance is determined by EMC.

8. The contact assembly in accordance with claim 7, wherein the contact leg (16) comprises a connecting section (16.2) that is connected with a support element which is snapped together with the detent strip (31).

9. The contact assembly in accordance with claim 8, wherein the support element is substantially U-shaped and is clampingly maintained by the bar (15) and the holding strip (13) on two oppositely located sides of the detent strip (31), the bar (15) is connected with the holding strip (13) by the cap section (14), and the connecting section (16.2) of the contact leg (16) is connected with the support element near the cap section.

10. The contact assembly in accordance with claim 9, wherein the contact spring strip (10) is in a snapped-in connection with the detent strip (31) of the front plate (30) and is held on the detent strip (31).

11. The contact assembly in accordance with claim 1, wherein the contact leg (16) comprises a connecting section (16.2) that is connected with a support element which is snapped together with the detent strip (31) of the front plate (30).

12. The contact assembly in accordance with claim 11, wherein the support element is substantially U-shaped and is clampingly maintained by the bar (15) and the holding strip (13) on two oppositely located sides of the detent strip (31), the bar (15) is connected with a holding strip (13) by a cap section (14), and the connecting section (16.2) of the contact leg (16) is connected with the support element near the cap section.

13. The contact assembly in accordance with claim 1, wherein the contact spring strip (10) is in a snapped-in connection with the detent strip (31) of the front plate (30) and is held on the detent strip (31).

14. The contact assembly in accordance with claim 3, wherein the contact elements (18) are punched out of and bent away from the contact leg (16).

15. The contact assembly in accordance with claim 3, wherein the contact elements (18) are nubs embossed out of the contact face.

16. The contact assembly in accordance with claim 3, wherein the contact elements (18) are arranged evenly spaced apart with respect to each other, and a spacing distance is determined by EMC.

* * * * *